United States Patent
Roth et al.

[19]

[11] Patent Number: 6,011,749
[45] Date of Patent: Jan. 4, 2000

[54] INTEGRATED CIRCUIT HAVING OUTPUT TIMING CONTROL CIRCUIT AND METHOD THEREOF

[75] Inventors: Alan S. Roth; Scott G. Nogle, both of Austin, Tex.

[73] Assignee: Motorola, Inc., Schaumburg, Ill.

[21] Appl. No.: 09/049,221

[22] Filed: Mar. 27, 1998

[51] Int. Cl.[7] .................................................... G11C 8/00
[52] U.S. Cl. ............................ 365/233; 365/194; 395/556
[58] Field of Search ............................... 365/233, 189.05, 365/194, 236; 395/556

[56] References Cited

U.S. PATENT DOCUMENTS

| | | | |
|---|---|---|---|
| 4,797,573 | 1/1989 | Ishimoto | 365/233 |
| 5,159,573 | 10/1992 | Yamada | 365/233 |
| 5,311,483 | 5/1994 | Takasugi | 365/233 |
| 5,440,514 | 8/1995 | Flannagan et al. | 365/194 |
| 5,648,932 | 7/1997 | Kang | 365/194 |
| 5,835,444 | 11/1998 | Kim et al. | 365/233 |
| 5,905,678 | 5/1999 | Pascucci | 365/194 |

OTHER PUBLICATIONS

Motorola Inc. 1998, Semiconductor Technical Data, "Advance Information 128K×36 and 256K×18 Bit Pipelined ZBT™ RAM Synchronous Fast Static RAM", pp. 1–20.

*Primary Examiner*—Tan T. Nguyen
*Attorney, Agent, or Firm*—Sandra L. Godsey

[57] ABSTRACT

An integrated circuit memory having a plurality of memory cells, output timing control means including frequency measurement means providing a frequency measurement count corresponding to a first frequency of the external clock signal and delay control means generating a delayed clock signal at the first frequency, wherein the delayed clock signal is delayed in time from the external clock signal in proportion to the first frequency, and data output control means outputting data from the plurality of memory cells responsive to the delayed clock signal. A method for adjusting output timing in a memory device including the steps of receiving an external clock signal, measuring a frequency of the external clock signal, generating a frequency count, determining an output delay proportional to the frequency, and generating an output clock at the external frequency and delayed from the external clock signal in proportion to the frequency.

17 Claims, 5 Drawing Sheets

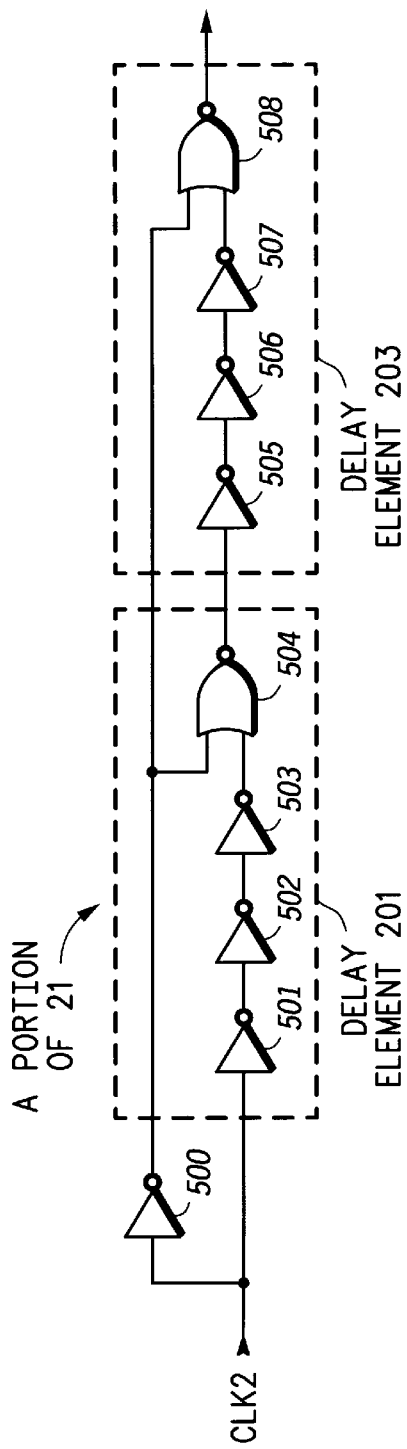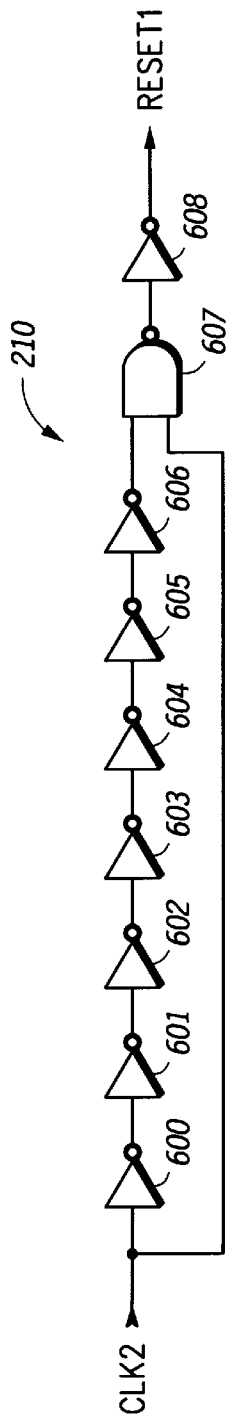
*FIG.5*
*FIG.6*

INTEGRATED CIRCUIT HAVING OUTPUT TIMING CONTROL CIRCUIT AND METHOD THEREOF

FIELD OF THE INVENTION

The present invention relates generally to memories, and specifically to clock frequency dependent output delay adjustment.

BACKGROUND

Typical stand alone memories are used in coordination with a micro processor, an ASIC circuit or some other type of control circuit. In these applications the stand alone memories coupled to the controller, or master, by way of a bi-directional data bus. In order to affect a read or write to the stand alone memory the master must send an enable signal to the memory. This handshaking of master and memory wastes valuable time on the data bus and typically requires at least one extra or dead cycle.

As applications and processing become faster and bus allocation becomes more critical it is necessary to reduce the number of handshaking cycles required and thus increase the efficiency of the memory in a data processing system. To this end several memories have been developed which require no enable signal or handshaking with the master. The memory becomes its own master determining when to provide and receive data and information from the data bus. One such memory initiates the data transfer to and from the itself. The data interface between the master and the memory is bi-directional (i.e. a common input/output). Here the memory and not the master determines when to release the bus and allow the master to drive data into the memory device. Likewise the memory determines when to start driving data out of the memory. The memory protocol allows data to be driven by the master and by the memory in a single clock cycle, however, not concurrently.

A problem arises as various ASIC technologies are used over a wide variety of clock speeds. There is also a significant number of types of masters operating at a large variety of clock speeds. This means that the memory is required to operate at over a large range of possible operating frequencies and under various operating conditions, such as over temperature. It is difficult to process one product that can operate over such a large range of frequencies while maintaining consistency and process yields. It is desirable to have one part that is applicable to several applications which will allow the memory to adjust an output delay based on the input frequency.

BRIEF DESCRIPTION OF THE DRAWINGS

FIG. 5 illustrates in circuit diagram form a delay element according to one embodiment of the invention;

FIG. 6 illustrates in circuit diagram form a delay circuit according to one embodiment of the present invention.

DETAILED DESCRIPTION OF THE PREFERRED EMBODIMENT(S)

Figure 1:
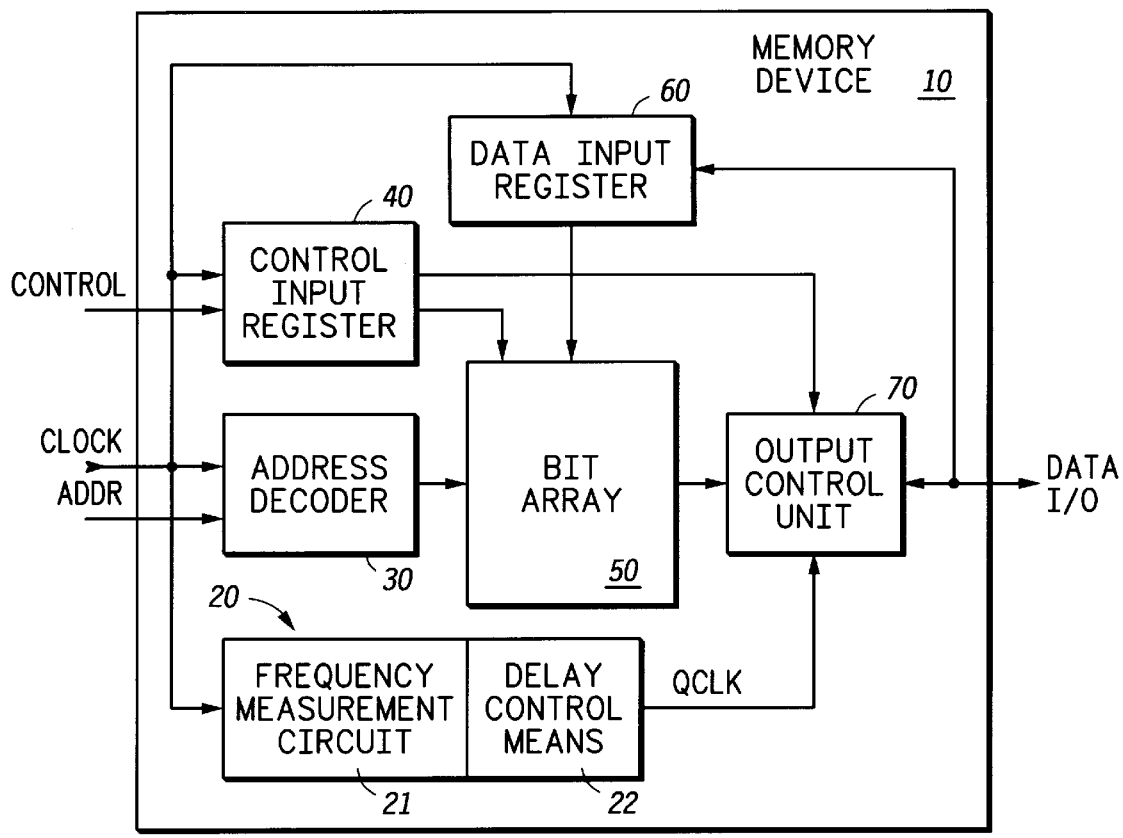
FIG. 1 illustrates in block diagram form a memory device according to one embodiment of the present invention.

Generally, the present invention relates to integrated circuit memories and methods for data communication. In a first aspect of the present invention, an integrated circuit memory includes a plurality of memory cells, an output timing control means, which includes a frequency measurement means receiving an external clock signal and in response providing a frequency measurement count corresponding to a first frequency of the external clock signal and a delay control means receiving the frequency measurement count from the frequency measurement means and generating a delayed clock signal at the first frequency, wherein the delayed clock signal is delayed in time from the external clock signal in proportion to the first frequency, and a data output control means coupled to the plurality of memory cells, the data output control means responsive to the delayed clock signal.

In the following description, numerous specific details are set forth such as specific registers, etc. to provide a thorough understanding of the present invention. However, it will be obvious to those skilled in the art that the present invention may be practiced without such specific details. In other instances, circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

A signal may be represented as a single conductor or multiple conductors, used to transfer one or more various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

According to one aspect of the present invention, an integrated circuit comprises an output timing control means having a digital frequency measurement means receiving an external clock signal and in response providing a frequency measurement count corresponding to a first frequency of the external clock signal, the digital frequency measurement means comprising at least one delay element and at least one memory storage unit, and having a delay control means receiving the frequency measurement count from the digital frequency measurement means and generating a delayed clock signal at the first frequency, wherein the delayed clock signal is delayed in time from the external clock signal in proportion to the first frequency, and the output timing control means having a data output control means responsive to the delay ed clock signal.

According to another aspect of the present invention, an integrated circuit memory comprises a plurality of memory cells, an output timing control means having a digital frequency measurement means receiving an external clock signal and in response providing a frequency measurement count corresponding to a first frequency of the external clock signal, the digital frequency measurement means comprising at least one delay element and at least one memory storage unit and a delay control means receiving the frequency measurement count from the digital frequency measurement means and generating a delayed clock signal at the first frequency, wherein the delayed clock signal is delayed in time from the external clock signal in proportion to the first frequency, and output timing control means having a data output control means coupled to the plurality of memory cells, the data output control means responsive to the delayed clock signal.

In accordance with another aspect, a method for adjusting output timing in a memory device includes the steps of receiving an external clock signal, dividing the external clock signal to form a divided clock signal, measuring a first frequency of the external clock signal, generating a frequency count signal having a first value corresponding to the first frequency, determining a first output delay proportional to the first value, and generating an output clock signal of the first frequency, the output clock signal delayed from the external clock signal by the first output delay, the output clock signal indicating an output transition.

FIG. 1 illustrates a memory device according to one embodiment of the present invention. Memory device 10 includes output timing control unit 20, address decoder 30, control input register 40, data input register 60, bit array 50, and data output control unit 70. Memory device 10 receives an external clock signal, a multiple bit address signal, and a control signal(s). Memory device 10 is coupled to an external data input/output (I/O) bus. The external clock signal is supplied to data input register 60, control input register 40, address decoder 30, and output timing control unit 20. Address decoder 30, control input register 40, and data input register 60 are coupled to bit array 50. Bit array 50 is then coupled to data output control unit 70.

Output timing control unit 20 generates an internal clock signal (QCLK) to data output control unit 70. The QCLK signal indicates at least one of the output parameters for data output control unit 70. Data is output from bit array 50 to the external data bus, DATA I/O, for a read of memory device 10. These output parameters control the transmission of data to the external data bus. Output timing unit 20 includes a clock sense unit or frequency measurement means 21 and clock drive unit or delay control means 22.

According to one embodiment of the present invention, memory device 10 is a fast static random access memory (FSRAM) device. According to an alternate embodiment of the present invention, memory device 10 is a synchronous memory device. According to another alternate embodiment, memory device 10 is a memory with self initiating data transfer. Typically a memory interfaces with an external device via a bi-directional data interface, i.e. data I/O bus. A self initiating data transfer type memory determines when to release the bus to allow data to be driven into the memory device. Likewise, the self initiating data transfer type memory device determines when to start driving data out of the memory. According to a self initiating data transfer type memory protocol, I/O may be driven both in to and out from the memory device within a single clock cycle, but not concurrently. The present invention is particularly applicable to a self initiating data transfer type memory where, for example, at slower clock frequencies, output parameters are to be delayed relative to an external clock. This allows a system of a slower frequency requirement to avoid bus contention by allowing the memory to remain in a high impedance state longer. The present invention may be used in any synchronous system where an external clock is provided to the memory device.

As illustrated in FIG. 1 output timing control unit 20 includes two blocks, frequency measurement circuit 21 and a delay control means 22. The frequency measurement circuit 21 is further illustrated in FIG. 2, where clock divider 200 divides an external clock signal into internal signals, true CLK2 and the complement of CLK2. By dividing an external clock signal it is possible to sample consecutive external clock cycles. Consecutive external clock cycles alternately cause true CLK2 and complement of CLK2 to transition to a high level. Each one of true CLK2 and complement of CLK2 is then sampled during a logical high level. The true CLK2 signal is propagated through the first series of sequential delay elements, 201, 203, through 205, connected in series as illustrated in FIG. 1. The true CLK2 signal is also supplied to a one pulse generator 210, which generates a reset signal, RESET1, in response to a rising edge of CLK2. RESET1 is received by gates 230, 232, through 240. Outputs of gates 230, 232, through 240 are coupled respectively to inputs to registers 214, 216, through 222. According to one embodiment of the present invention, gates 230, 232, through 240 are logical OR gates, and registers 214, 216, through 222 are implemented with S-R flip-flops. An input of gate 240 is coupled to ground. Each delay element in the series connected chain of sequential delay elements has an associated register and gate. The input to the gate associated with all delay elements, except the last delay element in the chain, is coupled to an output of the register associated with the next sequential delay element. For example, gate 230 is associated with delay element 201 and an input of gate 230 is coupled to the output of register 216. Register 216 is associated with delay element 203, which is the next sequential delay element.

Figure 2:
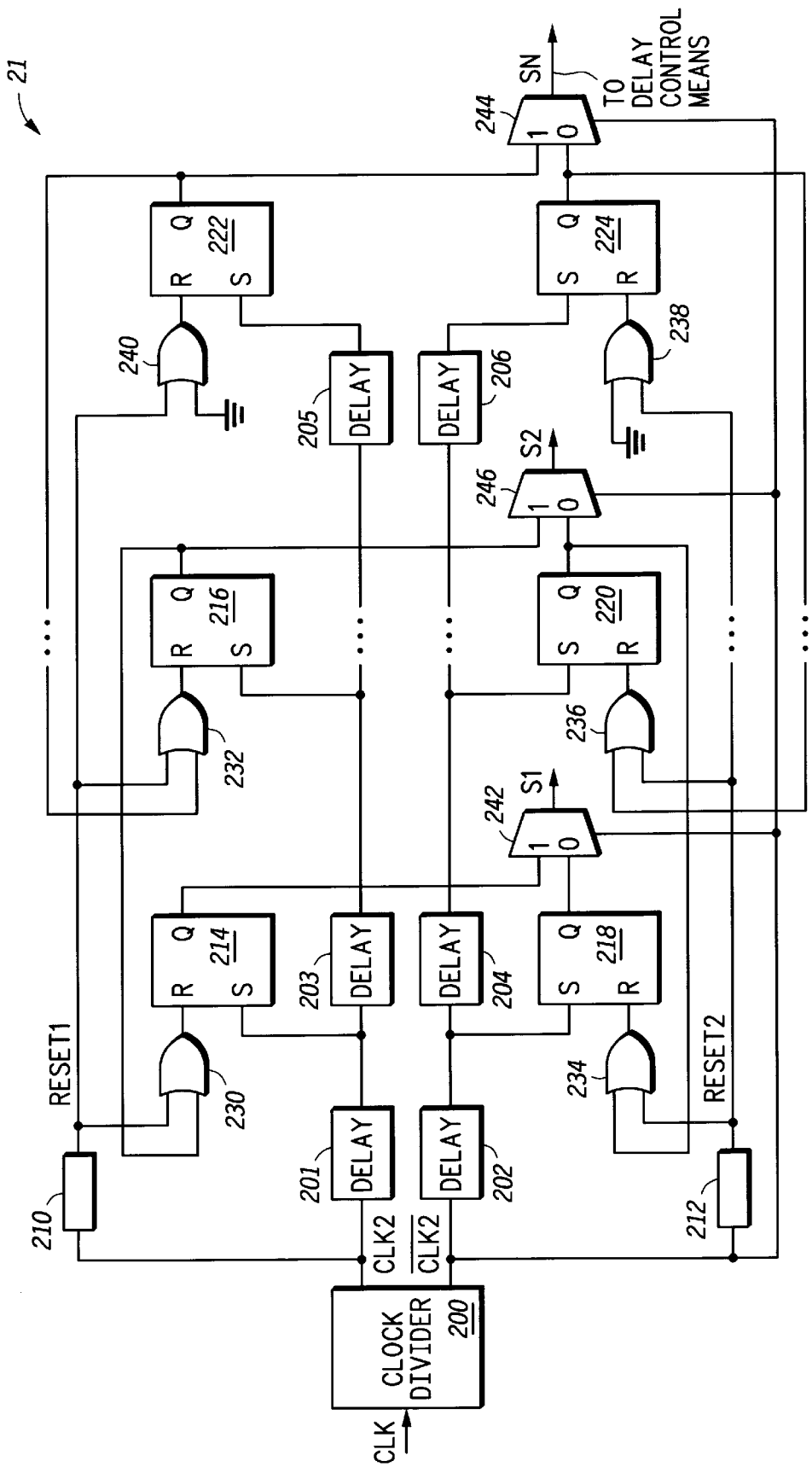
FIG. 2 illustrates in circuit diagram form a frequency measurement circuit according to one embodiment of the present invention.

Further illustrated in FIG. 2, the complement of CLK2 is propagated through a second series of sequential delay elements 202, 204, through 206. The complement CLK2 signal is also supplied to a one pulse generator 212, which generates a reset signal, RESET2, received by gates 234, 236, through 238. Outputs of gates 234, 236, through 238 are coupled respectively to inputs to register 218, 220, through 224. According to one embodiment of the present invention, gates 234, 236, through 238 are logical OR gates and registers 218, 220, through 224 are implemented with S-R flip-flops. The input to the gate associated with all delay elements, except the last delay element in the chain, is coupled to an output of the register associated with the next sequential delay element. For example, gate 234 is associated with delay element 202 and an input of gate 234 is coupled to the output of register 220. Register 220 is associated with delay element 204, which is the next sequential delay element.

When the true CLK2 signal propagates through the sequential delay elements 201, 203, through 205, and as the complement CLK2 signal propagates through the sequential delay elements 202, 204, through 206, the frequency of the external clock signal, CLOCK, provided to clock divider 200 is translated to a corresponding delay value. The delay value is represented by a combination of delay elements; the combination of delay elements is indicated by which of registers 214, 216, through 222 and registers 218, 220, and 224 are set. The registers are controlled by each series of sequential delay elements. Each delay element in each of the series of sequential delay elements, illustrated in FIG. 2, has a corresponding element in the other series. Delay element 201 corresponds to delay element 202, and the status of each effects signal S1. There is a similar relationship for the other elements, as illustrated in FIG. 2.

Translation of the frequency of CLOCK into a delay value involves propagation of true CLK2 and complement CLK2 through separate delay element series. As the signal propagates through a series, corresponding registers are set or cleared. According to one embodiment of the present invention, for a given series, a plurality of registers are used to indicate the delay value. According to one embodiment, only one register is set, while all others are reset. The divided clock signal propagates through the chain of delay elements while true CLK2 signal is at a logical high level. As the high leveled signal propagates through the chain, sequential registers are set, while the preceding registers are reset. The position of the single set register indicates the extent of propagation through the chain of delay elements. In this way, the period of the external clock signal is converted to integer form represented by $S_i$. The combination of the registers indicates the delay value. Alternate embodiments incorporate a variety of encoding schemes.

Additionally to effect the translation, delay element 202 receives the signal complement of CLK2. The series of delay elements 202, 204, through 206, which are connected in series, are configured in the same manner as the series 201, 203 through 205. An output of delay element 201 is coupled to an input of register 214 and to an input of the next sequential delay element 203. The output of register 214 is coupled to an input of a multiplexer (MUX) 242. The output of register 214 indicates the status of register 214, which is then provided to MUX 242. Likewise, an output of delay element 202 is coupled to an input of register 218 and to an input of the next sequential delay element 204. The output of register 218 is coupled to an input of MUX 242. The output of register 218 indicates the status of register 214, which is then provided to MUX 242. MUX 242 outputs a signal, S1. S1 is used by delay control means 22 to generate an internal delayed clock signal, QCLK. Similarly, the status of each of registers 216 through 222 effects each MUX 242, 246 through 244. MUX 242, 246 through 244 generate $S_i$.

Likewise, the outputs of other delay elements are each coupled to a register, where corresponding delay elements and their associated registers provide delay information to a common MUX. Specifically, the output of delay element 203 is coupled to an input of register 216, and an output of corresponding delay element 204 is coupled to register 220. The outputs of registers 216 and 220 are provided as the input to MUX 246 which generates signal S2. The output of delay element 205 is coupled to an input of register 222, and an output of corresponding delay element 206 is coupled to register 224. The outputs of registers 222 and 224 are provided as the input to MUX 244 which generates signal $S_N$ supplied to delay control means 22.

An alternate embodiment may incorporate registers 214, 216, through 222, and registers 218, 220, through 224 as another type of memory storage device which will store a status associated with a delay element.

Time pulse generators 210 and 212 generate signals RESET1 and RESET2 based on true CLK2 and complement CLK2 respectively. RESET1 resets registers 214, 216 through 222 prior to true CLK2 propagating through a series of delay elements 201, 203 through 205, and RESET2 resets registers 218, 220 through 224 prior to complement of CLK2 propagating through delay elements 202, 204 through 206. Outputs of MUX 242, 246, through 244 are coupled to delay control means 22, as illustrated in FIG. 3.

Figure 3:
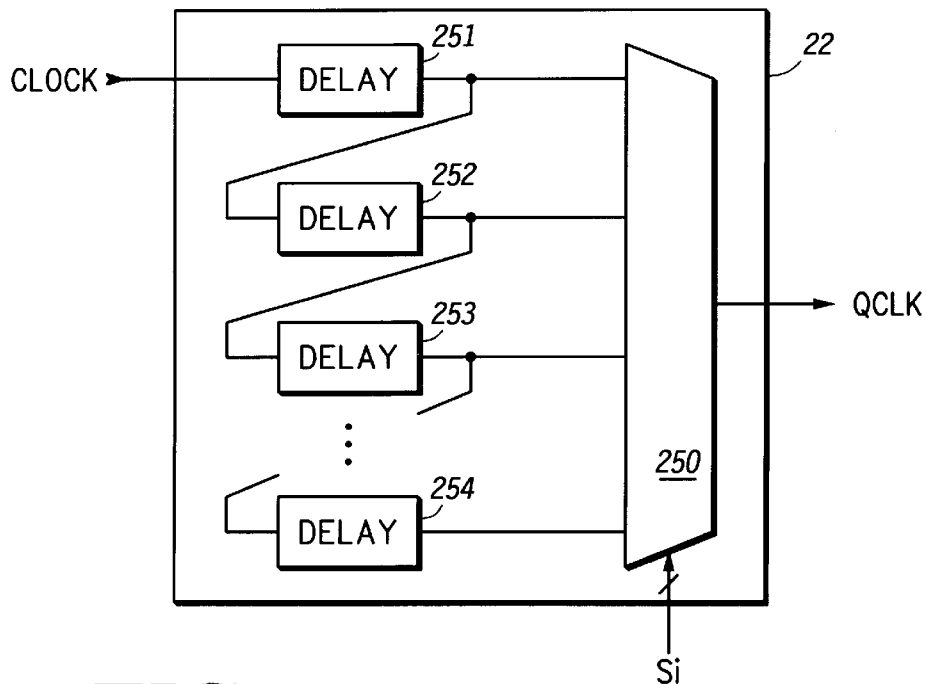
FIG. 3 illustrates in circuit diagram form a delay control means according to one embodiment of the present invention.

As referenced in FIG. 3, MUX 250 receives a measured frequency count from MUX 242, 246 through 244 of FIG. 2 as signal $S_i$, where i=1, 2, 3, . . . N, and N is the total number of delay elements in a delay element series. MUX 250 is also coupled to a series of delay elements 251, 252, 253, through 254. An external clock signal is propagated through delay elements 251, 252, 253, through 254, which are each individually and separately coupled to MUX 250. MUX 250 receives a translated delay value, Si, and determines a combination of delay elements necessary to provide QCLK. QCLK is generated at the frequency of the external clock, but delayed from the external clock by the delay value corresponding to that frequency. According to an alternate embodiment of the present invention the number of delay elements in delay control means 22 is proportional to the number of delay elements in frequency measurement circuit 21. In one embodiment of the present invention the total delay time for one series of sequential delay elements of frequency measurement circuit 21 is the same as the total delay time for the delay elements of delay control means 22.

Figure 4:
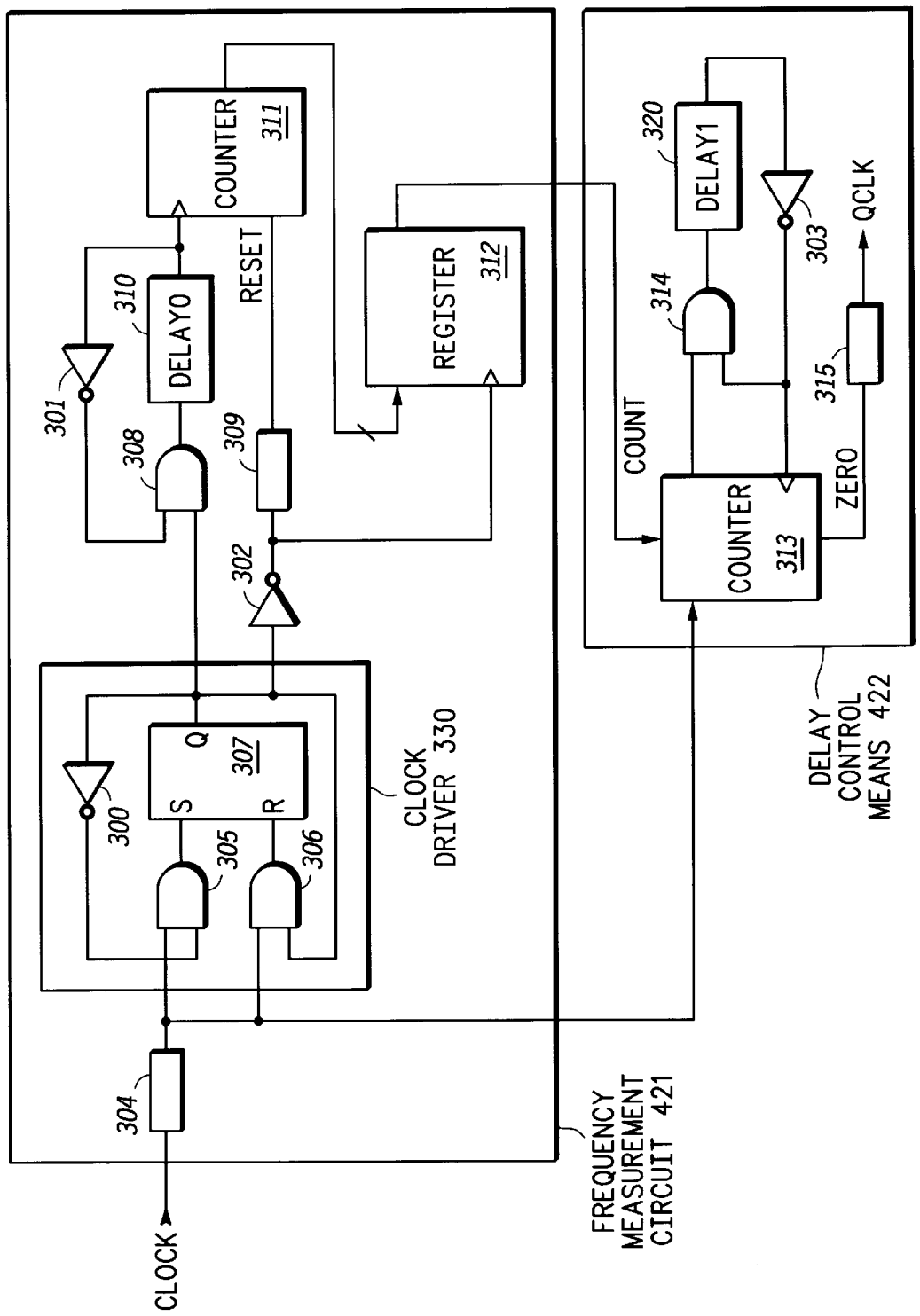
FIG. 4 illustrates in circuit diagram form an output timing control unit according to one embodiment of the present invention.

FIG. 4 illustrates an alternate embodiment of the present invention, where frequency measurement circuit 421 and delay control means 422 correspond to frequency measurement circuit 21 and delay control means 22 of FIG. 1. An external clock signal is provided to clock divider 330. Clock divider 330 includes a register 307, AND gates 305 and 306, and an inverter 300. A first output of clock divider 330 provides an input to AND gate 308. The output of AND gate 308 is coupled to delay element 310. The output of delay element 310 is provided to a counter 311 and to an input of inverter 301. The output of inverter 301 is coupled to an input for AND gate 308. Counter 311 increments a count each time a positive pulse propagates through delay element 310. A second output of clock divider 330 is provided to inverter 302 which is coupled to one time pulse generator 309. The output of inverter 302 is also coupled to a clock input of a memory storage unit, register 312. The output of one time pulse generator 309 is coupled to a reset input of counter 311. The output of counter 311 is coupled to register 312. Register 312 generates a count value to register 313, which is included in delay control means 422.

Delay control means 422 further includes gate 314, delay element 320, inverter 303, and a one time pulse generator 315. Counter 313 is coupled to a first input of AND gate 314. Counter 313 also receives an input from the external clock signal. When a count value expires, counter 313 outputs a signal, ZERO, to the one time pulse generator 315. In response, one time pulse generator 315 outputs QCLK. The output of AND gate 314 is coupled to an input of delay element 320. An output of delay element 320 is coupled to an input of inverter 303. The output of inverter 303 feeds back to counter 313 and also is the second input to AND gate 314. The alternate embodiment illustrated in FIG. 4 reduces the need for a series of delay elements as illustrated in FIG. 2.

The embodiment illustrated in FIG. 4 provides a method for generating an internal clock to control data output, where the internal clock is generated at the frequency of an external clock and has a delay measured from the external clock, where the delay is proportional to the frequency of the external clock. The external clock is first divided by two to generate a divided clock signal having a true and a complement component. A counter then tracks the number of times that a high of the cycle of the divided clock makes a trip through delay element 310. Note that alternate embodiments may utilize the low cycle of the divided clock, or may count cycles of the external clock directly. Counter 311 is reset during the low portion of the divided clock and the count is updated and stored in multiple bit register 312. The count is provided from register 312 to counter 313. A transition edge of the external clock effects a load the count and counter 313 begins to count each time a round trip is made through delay element 320. When the count of counter 313 expires or zeroes out a signal is provided to one time pulse generator 315 to generate QCLK. The signal QCLK is delayed from the external clock, where the delay is a function of the external clock frequency and the ratio of delay element 320 to delay element 310. According to an alternate embodiment, delay element 320 and delay element 310 are approximately equal and the ratio of counter 311 to counter 313 is used to adjust the delay.

Referring again to FIG. 2, delay elements 201, 203, through 205 and 202, 204, through 206 provide a means of measuring the frequency of the external clock. A delay element according to one embodiment of the present invention is further detailed in FIG. 5. True CLK2 is propagated through a series of sequential delay elements, beginning with delay element 201. Delay element 201 includes sequentially coupled inverters 501, 502, 503, and logic gate 504. The output of inverter 503 is coupled to an input to gate 504. CLK2 is also provided to inverter 500; an output of inverter 500 is coupled to an input to gate 504. The output of gate 504 is coupled to the input of the next sequential delay element 203. Delay element 203 is similar to delay element 201, including sequentially coupled inverters 505, 506, 507, and logic gate 508. The output of inverter 500 is also coupled to an input to gate 508. The output of gate 508 is provided to the next sequential element in the series. The delay elements illustrated in FIG. 5 are repeated to form a series of sequential delay elements, as illustrated in FIG. 2. Alternate embodiments may include any number of these delay elements and may include alternate configurations within each delay element. According to one embodiment of the present invention, delay elements 202, 204 through 206, of FIG. 2, are similar to those illustrated in FIG. 5.

FIG. 6 illustrates one embodiment of a one time pulse generator circuit 210 of FIG. 2. Here true CLK2 is provided as input to a sequential series of inverters 600, 601, through 606, logic gate 607, and inverter 608. True CLK2 is provided directly to an input of gate 607. Inverter 608 outputs signal RESET1. Complement of CLK2 similarly generates signal RESET2.

Figure 7:
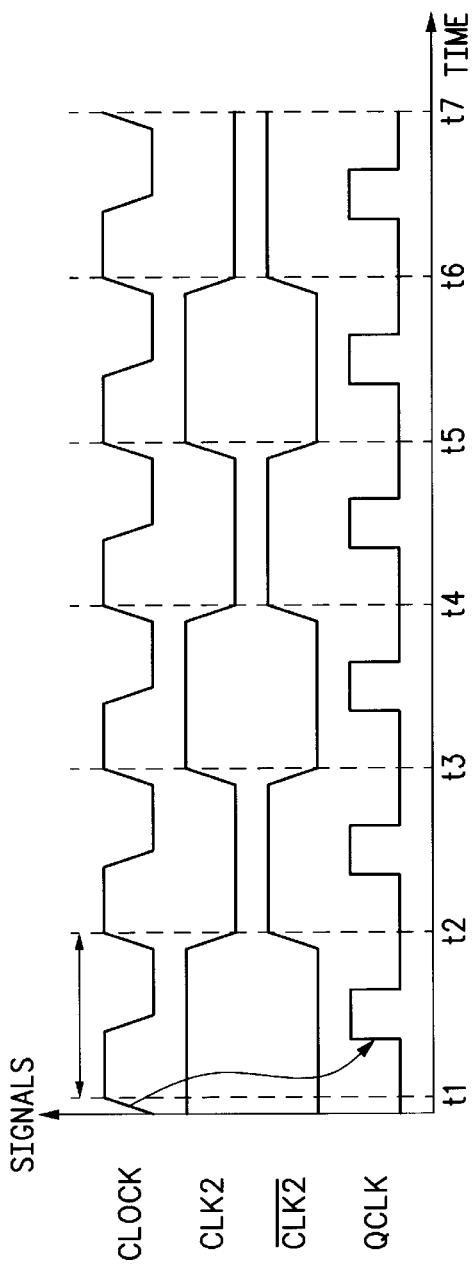
FIGS. 7 and 8 illustrates in timing diagram form signals according to one embodiment of the present invention.
Figure 8:
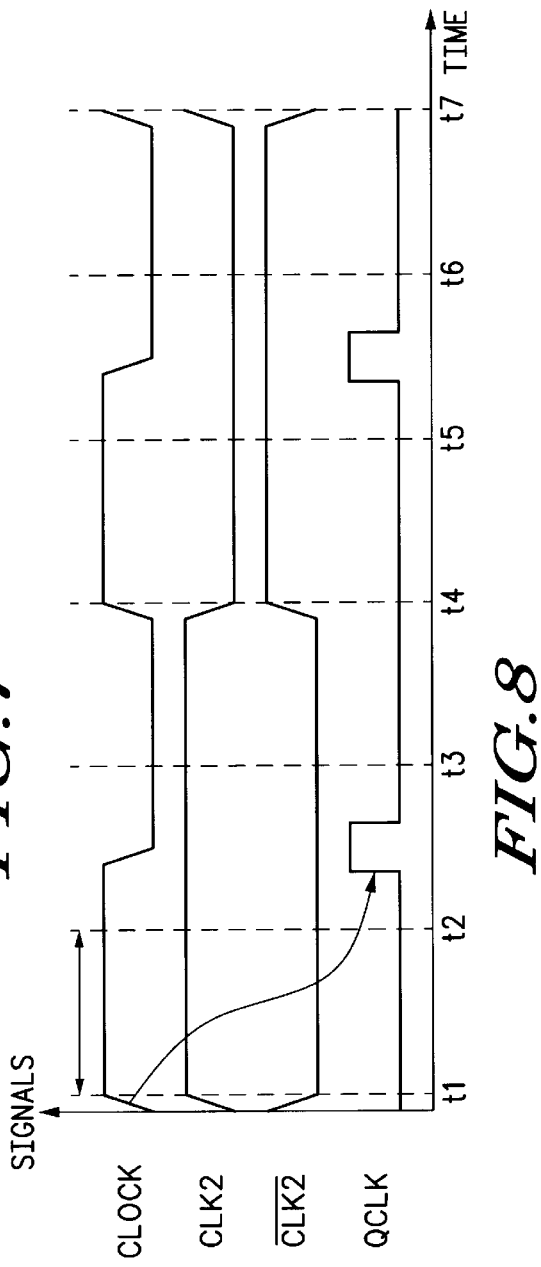

FIGS. 7 and 8 illustrate the timing of the various signals associated with one embodiment of the present invention. The horizontal axes represents time; the vertical axes represents the various signals received and generated in the memory device. Cycles of the external clock at the frequency of FIG. 7 are indicated by vertical lines, and the time interval between $t_1$ and $t_2$ of FIG. 7 is equal to the time interval between $t_1$ and $t_2$ of FIG. 8. FIGS. 7 and 8 illustrate that QCLK is generated at the same frequency as CLOCK and the delay measured from CLOCK is proportional to that frequency. The period of CLOCK in FIG. 7 is from $t_1$ to $t_2$, whereas the period of CLOCK in FIG. 8 is from $t_1$ to $t_4$. As the period increases, (i.e. the frequency decreases), the delay increases proportionally. As illustrated in FIG. 7 all of the various clocks are referenced to the external input clock, CLOCK. The external clock is the upper most signal in both illustrations of FIG. 7. True CLK2 and complement CLK2 represent the divided clock signals generated by clock divider 200. As illustrated in FIG. 7, the signal complement of CLK2 is the complement of true CLK2. The frequency of the external clock signal, CLOCK, determines the delay of the output clock signal, QCLK. As illustrated in FIG. 7 for a given external clock frequency the delay of QCLK is constant. The delay of QCLK changes in proportion to the frequency of external clock signal. This is illustrated in FIG. 8 where the external clock frequency is cut in half. As illustrated in FIGS. 7 and 8, the delay of QCLK is proportional to the frequency of CLOCK. The data input/output transition are triggered by QCLK.

The present invention provides a method of adjusting the delay of an output control clock in proportion to an external clock frequency. A first embodiment implements a series of sequential delay elements to measure the frequency of an incoming external clock. The frequency is then translated into a delay value, which is provided to delay control means, where another series of delay elements provides a delay indicated by the delay value. An internal clock is generated at the frequency of the external clock, having a delay proportional to that frequency. The internal clock triggers the transition of input and output data external to the integrated circuit. In a memory application, the present invention provides a means for a stand alone memory to interface with a variety of processors and circuits by adjusting its output timing proportionally to the frequency of the external clock. As the delay elements are included in the integrated circuit it is compatible with a broad range of specifications and operating environments. Additionally, the ability to adjust to a variety of conditions increases flexibility of manufacturing the integrated circuit.

One embodiment of the present invention allows for programmable selection and configuration of delay elements. The output delay time is programmed based on a known propagation time through a series of delay elements.

An alternate embodiment, replaces the series of delay elements with two delay loops, reducing the need for series of elements. A first delay loop measures the frequency and provides a count value. A second delay loop then executes according to the count value. When the count value expires, an internal clock is generated having a delay proportional to a ratio of the first delay loop to the second delay loop.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. An integrated circuit, comprising:
    output timing control means, comprising:
        digital frequency measurement means receiving an external clock signal and in response providing a frequency measurement count corresponding to a first frequency of the external clock signal, the digital frequency measurement means comprising at least one delay element and at least one memory storage unit; and
        delay control means receiving the frequency measurement count from the digital frequency measurement means and generating a delayed clock signal at the first frequency, wherein the delayed clock signal is delayed in time from the external clock signal in proportion to the first frequency; and
    data output control means responsive to the delayed clock signal.

2. An integrated circuit memory, comprising:
    a plurality of memory cells;
    output timing control means, comprising:
        digital frequency measurement means receiving an external clock signal and in response providing a frequency measurement count corresponding to a first frequency of the external clock signal, the digital frequency measurement means comprising at least one delay element and at least one memory storage unit; and delay control means receiving the frequency measurement count from the digital frequency measurement means and generating a delayed clock signal at the first frequency, wherein the delayed clock signal is delayed in time from the external clock signal in proportion to the first frequency; and data output control means coupled to the plurality of memory cells, the data output control means responsive to the delayed clock signal.

3. An integrated circuit memory as in claim 2, wherein the digital frequency measurement means comprises a clock divider means, the clock divider means dividing the external clock signal into a first signal and a second signal.

4. An integrated circuit memory as in claim 3, wherein the digital frequency measurement means comprises:
a first plurality of delay elements, each having an associated storage element.

5. An integrated circuit memory as in claim 4, wherein the digital frequency measurement means comprises:
a second plurality of delay elements, each having an associated storage element; and
wherein the first signal is a complement of the second signal; and
wherein the clock divider means provides the first signal to the first plurality of delay elements and the second signal to the second plurality of delay elements.

6. An integrated circuit memory as in claim 4, wherein the delay control means comprises:
a third plurality of delay elements, wherein the first plurality of delay elements corresponds to a first timing delay and the third plurality of delay elements corresponds to a second timing delay; and
a multiplexer circuit coupled to the third plurality of delay elements, the multiplexer circuit determining a combination of delay elements, wherein the combination is a function of a ratio of the first timing delay to the second timing delay and the frequency measurement count.

7. An integrated circuit memory as in claim 6, wherein the first plurality of delay elements corresponds to a first timing delay and the third plurality of delay elements corresponds to second different timing delay.

8. An integrated circuit memory as in claim 2, wherein the digital frequency measurement means comprises:
a delay element responsive to the external clock signal; and
a counter coupled to the delay element, the counter generating the frequency measurement count.

9. An integrated circuit memory as in claim 2, wherein the delay control means further comprises:
a delay element; and
a counter coupled to the delay element, the counter responsive to the frequency measurement count.

10. A method for adjusting output timing in a memory device, the method comprising the steps of:
receiving an external clock signal;
digitally measuring a first frequency of the external clock signal;
generating a frequency count signal having a first value corresponding to the first frequency;
determining a first output delay proportional to the first value; and
generating an output clock signal of the first frequency, the output clock signal delayed from the external clock signal by the first output delay, the output clock signal indicating an output transition.

11. A method as in claim 10, wherein the step of measuring comprises the steps of:
dividing the external clock signal to form a divided clock signal;
receiving the divided clock signal; and
propagating the divided clock signal at the first frequency through a series of sequential delay elements, and wherein propagation of the divided clock signal through a delay element sets an associated storage element to indicate the first value.

12. A method as in claim 11, wherein the associated storage element is a register.

13. A method as in claim 11, wherein the step of measuring comprises the steps of:
receiving the divided clock signal having a true portion and a complement portion;
propagating the true portion through a first series of sequential delay elements, wherein propagation of a positive edge of the true portion through a delay element of the first series of sequential delay elements sets an associated storage element;
propagating the complement portion through a second series of sequential delay elements, wherein propagation of a positive edge of the complement portion through a delay element of the second series of sequential delay elements sets an associated storage element; and
multiplexing outputs of the associated storage elements of true and complement propagation paths.

14. A method as in claim 11, wherein the step of determining a first output delay comprises the step of:
calculating a combination of delay elements, wherein the combination is a function of the frequency count signal.

15. A method as in claim 11, wherein the step of measuring comprises the step of:
propagating the divided clock signal through a delay element; and
incrementing a counter.

16. A method as in claim 11, wherein the step of determining a first output delay comprises the steps of:
initializing a counter according to the first value of the frequency count signal;
driving a delay element loop; and
decrementing the counter on each iteration of the delay element loop until the counter expires.

17. A method as in claim 11, wherein the step of determining a first output delay comprises the step of:
calculating a combination of delay elements based on the first value of the frequency count signal.

* * * * *